United States Patent [19]

Keren

[11] Patent Number: 4,859,950

[45] Date of Patent: Aug. 22, 1989

[54] BALUN CIRCUIT FOR RADIO FREQUENCY COILS IN MAGNETIC RESONANCE SYSTEMS

[75] Inventor: Hanan Keren, Kfar Saba, Israel

[73] Assignee: Elscint Ltd, Haifa, Israel

[21] Appl. No.: 194,975

[22] Filed: May 17, 1988

[30] Foreign Application Priority Data

May 26, 1987 [IL] Israel .................................. 82658

[51] Int. Cl.[4] .......................... G01V 3/00; H01P 5/10
[52] U.S. Cl. .................................... 324/322; 324/318
[58] Field of Search ............................ 333/12, 25, 26; 324/322

[56] References Cited

U.S. PATENT DOCUMENTS 4,707,662 11/1987 Kemner et al. ................. 324/322 X
4,712,069 12/1987 Kemner et al. ..................... 324/322
4,725,780 2/1988 Yoda et al. ..................... 324/322 X Primary Examiner—Paul Gensler
Attorney, Agent, or Firm—Sandler & Greenblum

[57] ABSTRACT

A balun circuit arrangement for radio frequency (RF) coils in magnetic resonance (MR) systems. The balun circuit arrangement comprises a conductor having a length equal to a quarter wavelength at the tuned resonance frequency of the (RF) coil.

7 Claims, 1 Drawing Sheet

BALUN CIRCUIT FOR RADIO FREQUENCY COILS IN MAGNETIC RESONANCE SYSTEMS

FIELD OF THE INVENTION

This invention is concerned with magnetic resonance (MR) systems, and more particulary to circuit arrangements for coupling radio frequency (RF) coils to the MR system for transmitting pulses to "tip" aligned spins and to receive signals generated during scan sequences.

BACKGROUND OF THE INVENTION

RF coils are an essential part of magnetic resonance systems both in spectroscopy and in imaging. Many different types of RF coils are used. For example, body coils, large enough to receive a patient therein, which are usually integral to the magnet system are used. Special surface coils designed to acquire data from specific parts of the body are also used. For example, if a mammalary scan is being carried out special coils for that type of examination will ordinarily be used.

As anyone who has worked with microwave or high RF frequencies knows, there are always balancing problems inherent at the high frequencies; especially, when coupling balanced and unbalanced circuits together. The RF coils in MR systems are generally connected to the MR system, and more particularly to the the RF generator and/or the RF receiver of the MR system using coaxial cable. Coaxial cable is necessary to protect the system from "picking-up" extraneous RF signals which are present in the environment. As is well known coaxial cable, features a braid separated from a current carrying central conductor by a plastic material. The braid acts as a shield that minimizes the pick-up of foreign frequencies by the cable.

Although coaxial cable is used, nonetheless, there are still coupling problems at very high frequencies. Amount other things the braiding itself tends to carry foreign induced currents. The induced current is often referred to as "skin current" since it flows on the outside of the braiding. The skin current tends to flow into the RF coil and upset the measurements being taken.

It is well known that the signals measured in MR systems are extremely small and accordingly, anything that disturbs the "Q" of the coil or adversly effects the signal to noise ratio (SNR) of the system has disastrous effects. The adverse effects of the foreign currents are especially pronounced in the special surface coils which are connected to the system, through relatively long cable sections and therefore are prone to radiate and receive foreign RF and/or noise signals.

Balance/unbalance (Balun) circuitry is used as one means for reducing the noise and/or foreign currents generated due to the induced currents in the coaxial cable. In the prior art these balun circuits have included tuned elements for filtering out or preventing the induced currents from disturbing the delicate data measurements.

The tuned elements, of course, introduce their own problems. For example, the use of tuned elements increases the cost of the system. In addition the use of extra elements has an inherent adverse effect on the reliability of the system. The stability of the added elements always has to be considered.

Accordingly, more efficient balun systems for reducing the interference caused by induced currents and noise picked up in the connecting cables of the RF coils or probes is something which those using RF coils in MR systems are constantly seeking.

BRIEF DESCRIPTION OF THE INVENTION

Accordingly, it is an object of the present invention to provide a balun circuit arrangement for RF coils in MR systems which overcomes or minimizes the adverse effects of induced currents in the cable system used for coupling the MR coils to the RF power transmitting and receiving equipment of the system.

It is a feature of the invention to provide such balun circuits that do not use tuned elements.

Accordingly, a balun circuit arrangement for RF coils in MR systems is provided, when said RF coils comprise an inductor coil, tuning capacitor means for tuning the said inductor coil to a desired resonant frequency for use in the magnetic resonance system, matching capacitor means for matching the impedance of the RF coil and the tuning capacitor means to line impedance, said balun arrangement comprising:

(a) cable means for coupling said RF coil to said MR system, (b) means for coupling said cable means across said matching capacitor, (c) balun means for connecting one side of said cable means to said inductor coil at the junction point of said tuning capacitor means and said RF coil to short out skin currents in said cable means and to simultaneously prevent and skin currents from reaching said RF coil, and said balun means comprising a conductor having a length substantially equal to one quater wavelength at the tuned resonance frequency of said RF coil.

According to a feature of the invention the cable means comprises a coaxial cable.

According to another feature of the invention, the balun arrangement comprises a first coaxial cable connecting the RF coil and its accompanying tuning and matching capacitors to the MR system, a second coaxial cable used as a balun and having the braid of the second coaxial cable shorted to the central conductor of the second coaxial cable, the balun means is connected to the first coaxial cable a quarter wavelength from the connection of the first coaxial cable across said matching capacitor.

According to a further feature of the invention, the RF coil is bridged by a combination of the tuning capacitor and the matching capacitor in series.

According to yet another feature of the invention the first coaxial cable has the braid thereof connected to the junction of the matching capacitor and the RF coil while the central conductor of the first coaxial cable is connected to the junction of the tuning capacitor and the matching capacitor.

Yet another feature of the invention comprises connecting the quarter wave length second coaxial cable from the junction of the tuning capacitor and the RF coil to the braid of the first coaxial cable at a point wherein the impedance looking into the cable matches the impedance of the RF coil circuit.

According to yet another feature of the invention the resonant frequency of the tuned RF coil is in the order of 81 mHz and the quarter wavelength second coaxial cable has a length that is substantially equal to 61cms.

BRIEF DESCRIPTION OF THE DRAWINGS

The above named and other objects and features of the present invention will be best understood when considered in the light of the following description of a broad aspect of the present invention, taken in conjunction with the following drawings; wherein.

GENERAL DESCRIPTION

Figure 1:
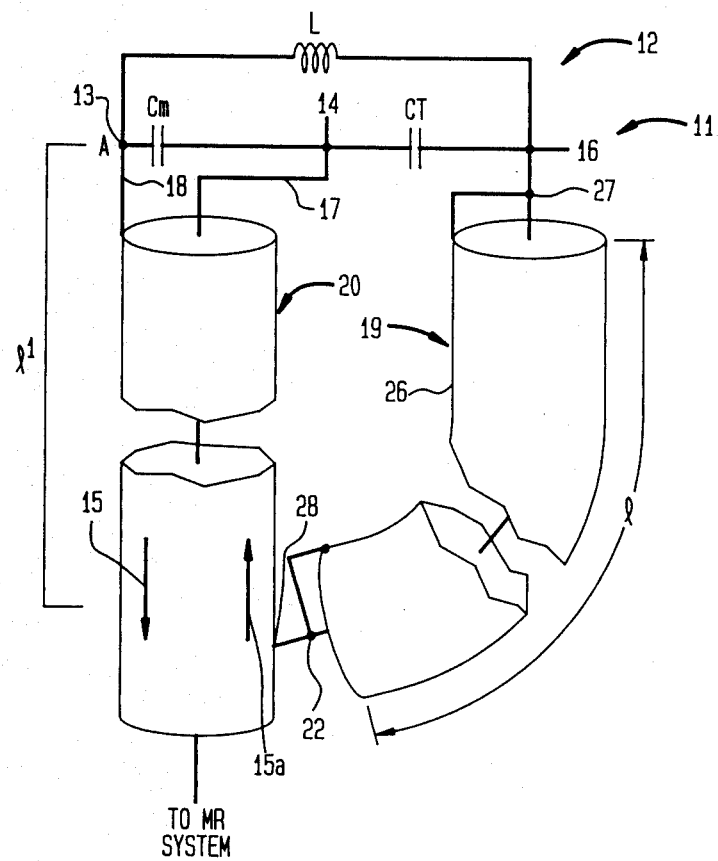
FIG. 1 is a schematic pictorial showing of the connections, including the unique balun circuit arrangement for joining the RF coil to the MR system.

FIG. 1 at 11 shows the inventive balun circuit arrangement for connecting RF coils, such as RF coil circuit 12 to MR systems. The coils may be used for both transmitting the RF pulses required for obtaining MR data and for receiving free induction decay (FID) signals from the subject during an MR scan sequences, for example.

The coil circuit 12 includes coil L. Bridging the RF coil L are a pair of series connected capacitors CT and CM. The capacitor CT is a tuning capacitor. In series with the tuning capacitor is the capacitor CM used for impedance matching. The matching capacitor CM is connected to the tuning capacitor CT at junction point 14. The other side of the tuning capacitor CT is connected to the other side of RF coil L at junction point 16. A first coaxial cable 20 is shown connected across the matching capacitor CM for connecting the RF coil 12 to the MR system (not shown). The cable 20 comprises two leads 17 and 18. Lead 17 is connected to the junction 14 of the tuning capacitor CT and the matching capacitor CM. Lead 18 is connected to the junction 13 of the matching capacitor and one end of the coil L.

In a preferred embodiment the cable 20 is a shielded cable. The lead 17 comes from the center conductor of the shielded cable while the lead 18 is preferably an extension of the shielding 25 of the cable.

A balun in the form of a shielded cable having a length l is shown at 19. In a preferred embodiment the length l is a quarter wavelength. The line 19 is shown connected to junction point 16 with central conductor 27. The other end of the quarter wavelength cable 19 is connected to the braid 25 of the cable 20 at point 28, which is a point where the cable 20 is of the length l' away from RF coil circuit 12. In a preferred embodiment the length l' is equal to the length l and both are a quarter wavelength.

Cable 19 has the braid 26 and central conductor 27 shorted together preferably at one end as indicated at connection 22. Accordingly, at point 28 of the cable 20 the quarter wavelenth section of cable 20 behaves like a short circuit. Looking from point 16, the quarter wavelength balun looks like an open circuit therefore there is no current lost between the RF coil circuit 12 and the braid. Looking from point 28, the induced currents on the braid 25 see a short and therefore are drained away to prevent any further degradation of the signal or the further receipt of noise.

The balun 19 and the conductor 18 act as a two pair transmission line having an impedance:

$$Z(AC) = j Z_o' \tan(2\pi l/\lambda)$$

where:
Z (AC) is the impedance looking into the balun circuit,
Zo' is the characteristic impedance of the balun cable,
l is the length of the balun, and
λ is the wave length of the RF signal or pulse.

When l is equal to λ/4 then the largest function is tan 90 degrees or infinity, indicative of resonance. When l is more or less than λ/4 the tan function will be positive or negative and capacitance has to be added or subtracted to tune and match the coil circuit.

Figure 2:
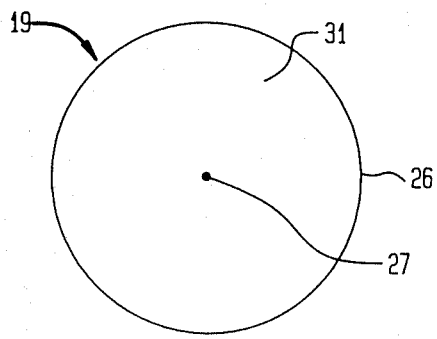
FIG. 2 shows an end view of a shielded cable.

The first coaxial cable 20, couples the coil circuit 12 to the MR system. The balun circuit 19 comprises a second coaxial cable. Both coaxial cables having the usual braided outer cover such as braid 26 and a central conductor 27 of cable 19, shown in FIG. 2. The central conductor 27 of cable 19 is shorted to the braid at 22. Conductor 27 at cable 19's other end is connected to the point 16 at one end of RF coil 12. The central conductor 27 is also connected at point 28 to the braid 18 of the first coaxial cable 20. The voltage across CT, on the tuning capacitor, is a high voltage, while the voltage across the matching capacitor is a low voltage. The voltage across both capacitors therefore, is essentially a high voltage.

Thus, the voltage between points 13 and 16 looks like high voltage to the induced currents shown as skin currents 15, 15a on braid 18. However, the currents flowing in the RF coil see an open circuit at point 16 and therefore, there is no loss from the RF coil. At the same time the currents in the braid are shortened and reduced to the point where they no longer cause the usual difficulties of high RF frequency induced currents in MR systems.

It should be understood that while the capacitors CT and CM are shown serially bridged across the inductor coil other arrangements such as series tuning could also be used within the scope of the invention.

While the invention has been described with reference to some preferred embodiment it should be understood that the description of this embodiment is exemplary only and should not act to limit the scope of the invention, which is defined by the accompanying claims.

What is claimed is:

1. A balun circuit arrangement for coupling radio frequency coil means in a magnetic resonance system to the RF transmitter-receiver, said RF coil means comprising:
    an inductor coil;
    tuning capacitor means coupled to said inductor coil means for tuning said inductor coil to a desired resonant frequency for use in systems; and
    matching capacitor means coupled to said tuning capacitor for matching the characteristic impedance of the RF coil to the characteristic impedance of the MR system,
    said balun circuit arrangement comprising:
        (a) a two conductor first cable means for coupling said RF coil means to said RF transmitter-receiver;
        (b) coupling means for coupling said first cable means across said matching capacitor and said tuning capacitor;
        (c) said coupling means including balun means for connecting one conductor of said two conductor cable means to said inductor coil at the point of coupling of said tuning capacitor means and said inductor coil to short skin currents in said first cable means and to simultaneously prevent said currents from reaching said RF coil means, and
        (d) said balun means being a second cable means that is substantially one quarter wavelength in length at the tuned resonance frequency of said RF coil means.

2. The balun circuit arrangement of claim 1 wherein said first cable means comprises first shielded cable means having a central conductor and an external braided shield.

3. The balun circuit arrangement of claim 2 wherein said balun means comprises a second shielded cable means having a central conductor and an external braided shield.

4. The balun circuit arrangement of claim 3 including means for connecting said central conductor of said second shielded cable means to the point of coupling of said RF coil and said tuning capacitor at one end and to the braid of said first shielded cable means at the other end.

5. The balun circuit arrangement of claim 4 wherein means are provided for shorting together the braid of said second shielded cable and the central conductor thereof proximate to said first shielded cable means.

6. The balun circuit arrangement of claim 5 wherein the means for shorting said braid and said central conductor of said second shielded cable is located on the connection between said first shielded cable and said second shielded cable wherein said central conductor of the second shielded cable is coupled to the braid of the first shielded conductor at a point one quarter wavelength removed from said RF coil means.

7. The balun circuit arrangement of claim 1 wherein the combined capacitance of said tuning and matching capacitor means is increased of decreased depending on whether the balun means is more or less than one quarter wavelength.

* * * * *